(12) United States Patent
Kolbeck et al.

(10) Patent No.: US 7,782,167 B2
(45) Date of Patent: Aug. 24, 2010

(54) METHOD TO PRODUCE A CURVED COIL, IN PARTICULAR A SUB-COIL OF A GRADIENT COIL FOR A MAGNETIC RESONANCE APPARATUS

(75) Inventors: Thomas Kolbeck, Kalchreuth (DE); Johann Schuster, Oberasbach (DE); Lothar Schoen, Neunkirchen (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/209,290

(22) Filed: Sep. 12, 2008

(65) Prior Publication Data

US 2009/0066463 A1    Mar. 12, 2009

(30) Foreign Application Priority Data

Sep. 12, 2007 (DE) ........................ 10 2007 043 443

(51) Int. Cl.
*H01F 27/30* (2006.01)
*H01F 5/00* (2006.01)
*H01F 7/06* (2006.01)

(52) U.S. Cl. ........................ 336/207; 336/200; 336/205; 336/206; 336/208; 29/606

(58) Field of Classification Search ........................ None
See application file for complete search history.

(56) References Cited

U.S. PATENT DOCUMENTS

| | | | | | |
|---|---|---|---|---|---|
| 2,014,524 | A | * | 9/1935 | Franz | 336/200 |
| 3,969,846 | A | * | 7/1976 | Scott | 49/504 |
| 5,864,235 | A | * | 1/1999 | Moritz et al. | 324/318 |
| 6,369,687 | B1 | * | 4/2002 | Akita et al. | 336/234 |
| 6,822,548 | B2 | * | 11/2004 | Wang et al. | 336/200 |
| 2002/0121956 | A1 | * | 9/2002 | Kuth | 336/200 |
| 2004/0227516 | A1 | * | 11/2004 | Endt | 324/318 |
| 2005/0198812 | A1 | * | 9/2005 | Schuster et al. | 29/606 |
| 2008/0018424 | A1 | * | 1/2008 | Takahata | 336/20 |

FOREIGN PATENT DOCUMENTS

DE    42 32 882    3/1994

* cited by examiner

*Primary Examiner*—Elvin G Enad
*Assistant Examiner*—Mangtin Lian
(74) *Attorney, Agent, or Firm*—Schiff Hardin LLP

(57) ABSTRACT

In a method to produce a curved coil, in particular a sub-coil of a gradient coil for a magnetic resonance apparatus, at least one conductor is wound corresponding to a predetermined pattern on a winding plate, and a winding plate composed of multiple plate elements that are moveable relative to one another is used that is formed into a curved shape after the winding of the conductor, in which curved shape the conductor is fixed while maintaining the curved shape.

3 Claims, 4 Drawing Sheets

METHOD TO PRODUCE A CURVED COIL, IN PARTICULAR A SUB-COIL OF A GRADIENT COIL FOR A MAGNETIC RESONANCE APPARATUS

BACKGROUND OF THE INVENTION

1. Field of the Invention

The present invention concerns a method to produce a curved coil, in particular a sub-coil of a gradient coil for a magnetic resonance apparatus as well as a winding plate for use in this method.

2. Description of the Prior Art

Large-area coils, for example sub-coils of a gradient coil of a magnetic resonance apparatus, are typically produced by introducing a wire of one or multiple millimeters in diameter into the groove of a winding plate. In the case of a gradient sub-coil, the groove path corresponds to a predetermined pattern that in turn is designed with regard to the magnetic fields to be generated by means of the sub-coils. After wrapping the conductor, which protrudes slightly from the groove in the wrapped position, a support plate is typically placed upon it that is firmly connected with the conductor by an adhesive layer. Because gradient coils are typically cylindrical coils, it is necessary to bend the sub-coils so produced on a corresponding radius, thus to curve them so that they can be integrated into the gradient coil that, as is generally known, is composed of multiple such sib-coils as well as additional magnetic field-generating or shielding components, after which the gradient coil together with all components is cast with an insulating material (advantageously a casting resin). This deforming ensues in a mechanical manner, meaning that the composite composed of conductor (typically a copper conductor) and insulating support plate, on which the conductor is overlaid over its entire surface, is deformed to the curvature of the sub-coil by means of a press or a roller. High shearing strains, which place high demands on the bonding and shear resistance of the employed adhesive as well as the support plate itself, thereby occur between the conductor and the support plate. These shearing strains become greater the tighter the arc radius. For some coils (such as, for example, a head coil as part of a magnetic resonance apparatus), very tight arc radii are formed. These high shearing strains can now lead to the situation that the adhesion locally detaches in the forming, or detaches at a later point in time due to the high strain load, which either makes the sub-coils unusable or leads to problems in the operation of the gradient coil after integration into the gradient coil has already occurred.

SUMMARY OF THE INVENTION

An object of the present invention is to provide a method that enables the production of a curved coil in a simple manner without the aforementioned problems.

This object is achieved in accordance with the invention by a method wherein at least one conductor is wound corresponding to a predetermined pattern on a winding plate, and wherein a winding plate formed of multiple plate elements that can be moved relative to one another is used that is brought into a curved shape after the winding of the conductor, in which curved shape the conductor is fixed while maintaining the curved shape.

Instead of the flat and one-piece winding plates that are conventionally used, the method of the invention uses a winding plate that is formed of multiple plate elements that are movable relative to one another. These plate elements can be pivoted relative to one another so that in principle the possibility exists to bring the winding plate itself into an approximately curved shape that largely corresponds to the desired coil shape. To produce the sub-coil, the one or multiple wires are now strung in the (initially flat) winding plate (thus are introduced into the groove(s)), with the individual plate elements being provided with the corresponding groove segments that result in their entirety from the predefined, continuous pattern. The winding plate, together with the wound conductor, is subsequently brought into the curved shape, which is achieved by the introduction of the flat winding plate into a press that has a radius matrix (mold) with a radius corresponding to the desired coil radius, and pressing the winding plate with a correspondingly shaped stamp. After the deformation of the winding plate (and of the conductor therewith), this is then fixed in the curved shape, which can ensue in different ways (which are subsequently discussed in detail).

The fundamental basis of the method according to the invention is that the winding plate itself (together with the conductor) is deformed, only after which does the conductor fixing ensue. The conductor is thus fixed in the deformed, curved position, such that the aforementioned problems that result from a deformation of the composite structure (composed of the conductor and the support plate permanently bonded therewith) cannot occur in the method according to the invention. If the fixing of the curved conductor ensues, for example, by corresponding plate-shaped or band-shaped fixing elements that are glued to the conductor, this enables a simpler and more cost-effective adhesion method to be used since the connection points between fixing element and conductor no longer need to be designed so that they withstand high tensions that result in the prior art from the deformation of the composite structure. This also offers the possibility to use fixing elements that—because they do not need to be made of a material that is itself sufficiently deformable—can be matched in terms of their material properties to the usage purpose (for example can be optimized with regard to their heat conductivity), which can sometimes lead to encumbrances of the flexibility of the respective fixing element. In principle the possibility also exists to fix the conductor or conductors only locally by means of a fixing element because a large connection surface is not required in light of the absence of the tensions introduced due to curvature.

As already described, the possibility exists to fix the conductor or conductors by means of at least one fixing element that is attached to the curved conductor and that is permanently connected (in particular bonded) with this. Similar to the prior art, such a fixing element can be a plate that the conductor covers over its entire surface. Alternatively, the possibility exists to design the fixing element as bands and to cover only a portion of the curved conductor with it. Such a fixing element can in principle be pre-curved, thus can consequently inherently have the corresponding curvature. However, it is also conceivable to curve the corresponding fixing element only upon attachment to the conductor, wherein this is in principle completely harmless as the connection (for example adhesion) only ensues after the deformation of the fixing element.

As described, it is possible to use band-shaped detector elements, wherein multiple such fixing element bands can also be used depending on the size of the conductor pattern. These can now be attached in arbitrary position or, respectively, arrangement relative to one another on the pre-curved conductor or conductors provided on the plate side. For example, a star-shaped pattern is possible in the production of fingerprint coils. The possibility also exists to attach the fixing element bands in selected positions—for example where multiple conductor loops run relatively closely adjacent to one another—in order to be able to cover as many conductors as possible with one fixing band. The use of such relatively narrow fixing bands is advantageous since a very good perfusion of the coil structure with casting resin in production and casting of a gradient coil is hereby enabled, and the heat transfer can be improved because a relatively large area is not occupied by the insulating fixing element. This means that the cooling of a gradient coil is improved; higher powers are possible given the same maximum temperature.

For example, a fixing element composed of a fibrous tissue can be used as a fixing element. A fiberglass tissue that is embedded in a corresponding support matrix (such as an epoxy resin, for example) is suitable. The possibility also exists to use a fixing element composed of a material having high heat conductivity, or a fixing element containing such a material. In the case of the use of a fibrous tissue that is embedded in a support matrix, for example, the heat conductivity of such a fixing element can be adapted or optimized via introduction of suitable filler materials such as $Al_2O_3$ or BN, for example.

Given use of one or more such fixing elements, in principle the possibility exists to apply these on the outside or the inside of the conductor depending on how the sub-coil should be designed. The use of the jointed winding plate enables the conductors to be wound on the inner plate side or the outer plate side. Depending on the usage purpose, a sub-coil fixed on the inner circumference or on the outer circumference via one or more fixing elements can be produced.

In addition to the production of a sub-coil using a fixing element directly supporting the conductor, wherein the finished sub-coil (formed of the conductor and the fixing element or fixing elements) is lifted from the winding plate after application of the fixing element, an alternative to the invention provides to place the curved winding plate around a winding spindle and to affix the conductor (arranged on the inner side of the winding plate, facing the winding spindle) on the winding spindle with at least one tightening strap. According to this invention embodiment, no quasi-inherently stable sub-coil is produced as in the case of the use of one or more fixing elements; rather, here the winding plate together with conductor is placed directly around a winding spindle of a winding machine. Such a winding spindle serves for the layer-by-layer construction of a gradient coil, meaning that the individual coil elements are arranged relative to one another and fixed relative to one another on the winding spindle. The structure is subsequently correspondingly cast. The use of a jointed winding plate according to the invention now allows the conductor to be arranged after corresponding deformation of the winding plate together with conductor on the winding spindle. A tightening strap that is appropriately positioned in order to fix the conductor on the winding spindle serves to fix the conductor. The winding plate is subsequently removed; the conductor is held directly on the winding spindle by means of the tightening strap itself. In this embodiment, no self-supporting sub-coil is produced but rather a quasi-unstable sub-coil consisting merely of the conductor and the tightening strap (which, however, has no support function but merely serves to affix the conductor on the winding spindle).

Before the wrapping of the conductor on the winding plate, the tightening strap or tightening straps are advantageously placed in this; for example, a groove running transversely to the pivot direction of the individual plate elements relative to one another and serving to accommodate the tightening strap is provided for this. The conductor is thus wound around the tightening strap; this lies underneath the conductor. In the installation situation on the winding spindle, it is then located on the outside of the conductor so that this can be tensioned and fixed in a simple manner.

It is possible to simultaneously place two or more winding plates around the winding spindle, wherein the multiple winding plates in their entirety circulate 360° around the winding spindle, and wherein the tightening straps of the adjacent winding plates are connected with one another to form a tightening strap circulating 360°. Here the tightening straps of the individual winding plates are connected with one another so that overall a tightening strap circulating 360° results. The tightening straps of each winding plate protrude somewhat from this so that each strap end can be connected with the adjacent strap end of the adjacent winding plate. The three or four or more individual conductors of the respective winding plates are fixed as a whole and at the same radius on the winding spindle.

In addition to the method, the invention also concerns a winding plate with at least one groove to accommodate a conductor to be wound on it, which winding plate is in particular suitable for use in the method of the described type, wherein according to the invention the winding plate is composed of multiple plate elements that are movable relative to one another.

Each plate element has a longitudinal, rectangular shape, and two plate elements can be moved relative to one another around an axis proceeding parallel to its longitudinal edge. The winding plate thus overall has a quadratic or rectangular shape formed by an arbitrary multitude of individual plate elements whose number is determined corresponding to the coil size and the desired arc radius.

The mobility of the plate elements relative to one another can be achieved in different ways. According to a first embodiment of the invention, two plate elements can be connected with one another via an articulation (hinge joint) to enable the relative movement. Such an articulation can be formed by two bearing lugs situated adjacent to one another that are penetrated by an axle bolt. A bolt hinge or shaft hinge effectively results.

Alternatively, the articulation can be formed by two joint segments, of which the one encompasses the other. On one side of a plate element is a wrap-around segment, i.e. a type of round hook that is open at the sides that pivotally encompasses a joint segment located on the other side of the adjacent plate element.

Because bending the winding plate only in the middle region results in no radius change, and because the pattern of the curved conductor that is to be held is defined (thus consequently may exhibit only minimal tolerances), in an embodiment of the invention the articulation is fashioned such that the separation of two coupled plate elements is variable. This means that a length compensation between two plate elements is possible, achieved by the joint connection. Depending on whether the conductor is located on the inner or outer curved side of the winding side, this offers the possibility to design the compensation such that the conductor in the curved shape exactly corresponds to the desired geometry and the length changes to the plate outside or inside due to the curvature.

As an alternative to producing the relative mobility by an articulation, two plate elements can be connected with one another by a flexible connection element such that they can move relative to each other. Such a connection element is, for example, a metal band that is permanently connected (in particular welded) with both plate elements, the metal band advantageously extending across all plate elements. Such a metal band (for example made from spring steel) offers a sufficient mobility of the plate elements relative to one another, however also sufficiently securely fixes these. In this case the plate are made from metal, but they can also be made from plastic, in which case the metal band is then bolted to the individual plate elements, for example. This offers the possibility to use plate elements produced in a simple extrusion method, which plate elements are merely to be processed to form a winding plate with articulations. Overall this makes the manufacture of the articulated winding plate simple and cost-effective.

DESCRIPTION OF THE PREFERRED EMBODIMENTS

Figure 1:
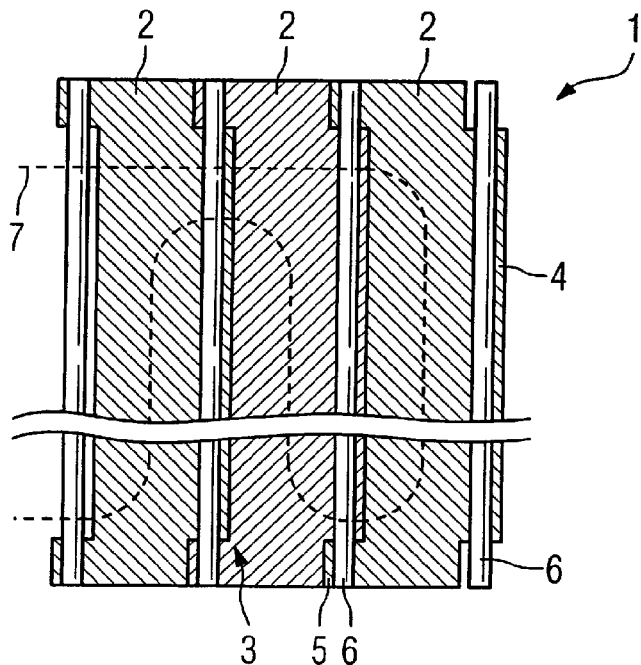
FIG. 1 illustrates a portion of a winding plate of a first embodiment according to the invention.
Figure 2:
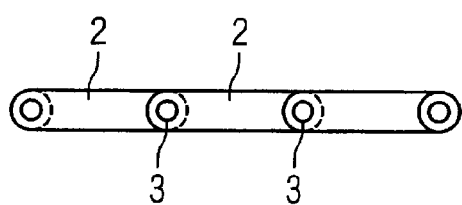
FIG. 2 is a side view of the winding plate of FIG. 1.
Figure 5:
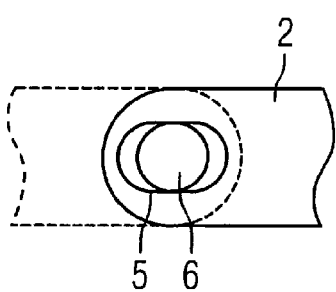
FIG. 5 is a detail view of the articulation between two winding plates.
Figure 6:
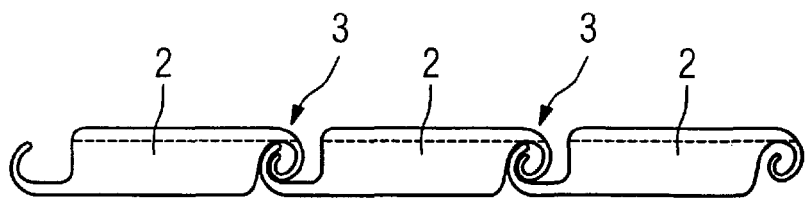
FIG. 6 is a side view of a winding plate of a second embodiment of the invention.

FIG. 1 shows a winding plate 1 according to the invention, consisting of multiple rectangular plate elements 2 made from metal or plastic. The more plate elements 2 that are provided, the better that a rounded, curved shape can be achieved. The individual plate elements 2 are connected with one another such that they can pivot via articulations 3 in the region of their adjacent longitudinal edges. At every plate element a first bearing lug 4 is provided on the one side and two bearing lugs 5 are respectively provided on the other side (there at the ends). The bearing lugs 4 and 5 engage in one another and are penetrated by an axle or shaft 6 to form the articulation, which is shown in the section view in FIG. 1. The two bearing lugs 5 are therefore executed somewhat oblong (see FIG. 5) so that a transverse mobility of two adjacent plate elements 2 is possible, meaning that these can vary somewhat in their separation in order to enable a longitudinal compensation. The two plate elements thus have some play relative to one another.

In the shown example, a winding groove 7 (presented only with dashed lines) in which a conductor 8 can be wrapped to form a coil is provided on the top or bottom of the winding plate 1. The winding groove 7 has an arbitrary pattern; all shapes shown in the figures are only of an exemplary nature. The winding groove 7 continues from plate element to plate element so that overall a closed loop results.

Figure 3:
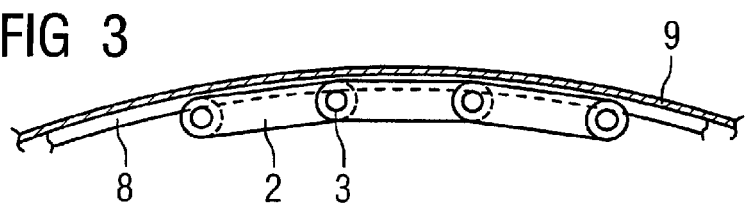
FIG. 3 is a side view of the winding plate with a wrapped conductor and placed fixing element after deformation of the winding plate.

To produce such a coil, the conductor 8 is initially introduced into the winding groove; it is thus wound on the winding plate 1. The winding plate is then mechanically deformed and curved via a suitable press or the like (see FIG. 3). An extensive positional stability of the wrapped conductor, and therefore maintenance of the conductor geometry, can thereby be achieved via the length compensation of the articulations 3. This means that the winding plate 1 together with conductor 8 is brought into the defined curved shape, as FIG. 3 shows. The conductor 8 protrudes somewhat from the winding plate groove 7; for fixing a fixing element 9 is attached (for example glued) to the conductor plate top in the shown example. This fixing element can be a plate-shaped fixing element that supports the entire wound conductor structure, or individual bands that are directed only in segments across the conductor plate structure. Such bands can be placed according to an arbitrary pattern. It is merely required to fix the wrapped conductor structure so that the entire sub-coil (which is self-supporting in the pre-curved shape) can be extracted from the winding plate 1. The deformation of the conductor into the desired end shape that the produced coil should have thus ensues here before the fixing of the conductor via one or more fixing elements.

Figure 4:
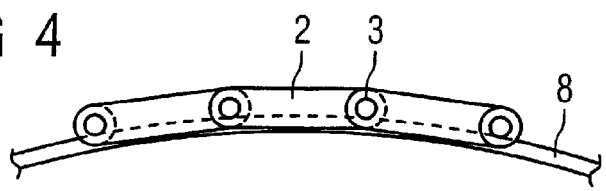
FIG. 4 is a view corresponding to FIG. 3, with the conductor wound on the other side.

FIG. 4 shows an exemplary embodiment in which the winding groove is on the opposite side of the winding plate; here the wire has also already been placed and the winding plate 1 deformed. Here the wire is thus located on the inside of the winding plate (relative to the curved shape) while in FIG. 3 it is arranged on the outside of the plate.

Figure 7:
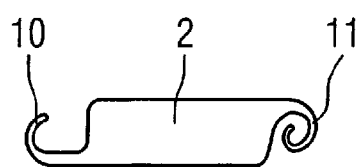
FIG. 7 is a side view of an individual winding plate element in the second embodiment.
Figure 8:
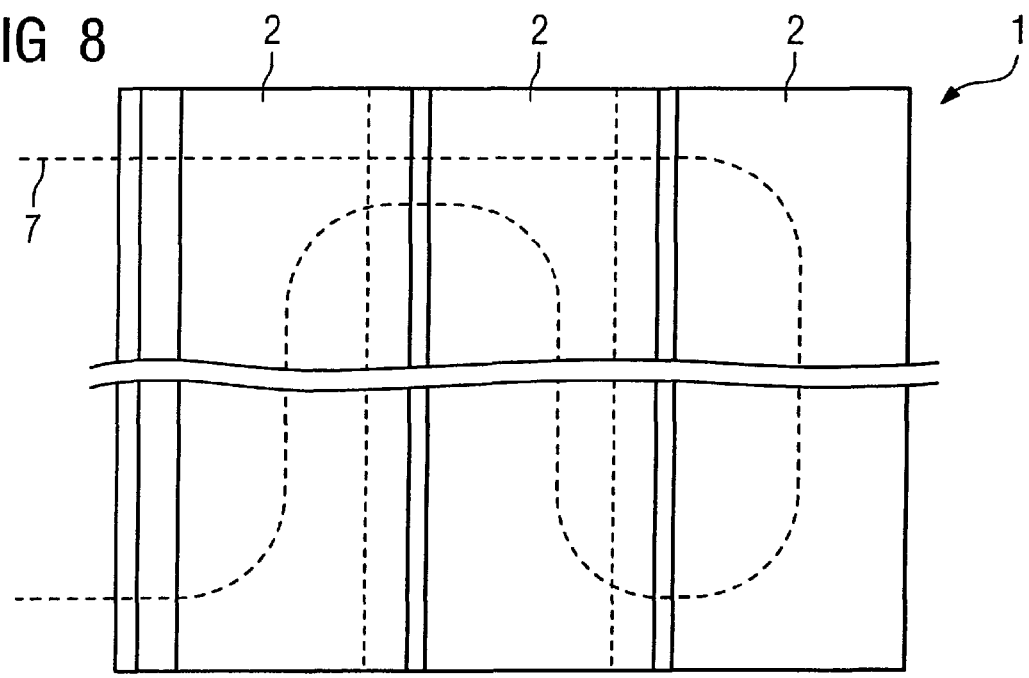
FIG. 8 illustrates the conductor path in the winding plate in accordance with the invention.
Figure 9:
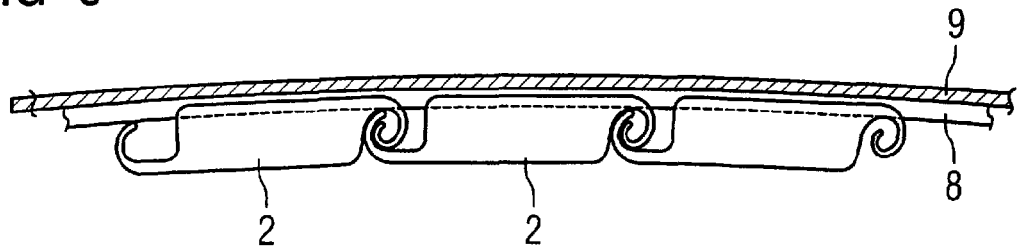
FIG. 9 is a side view of the winding plate with a wound conductor and an attached fixing element.

FIG. 8 shows a further embodiment of a winding plate 1, likewise formed of multiple plate elements 2 that are again pivotable relative to one another via respective articulations 3. Here the pivot axes also precede parallel to the longitudinal sides of the rectangular plate elements 2. Such a plate element 2 can be shown separately in FIG. 7. It possesses on the one side a first, essentially hook-shape joint segment 10 and on the other side a second joint segment 11 executed in the manner of an in-roll. To connect two plate elements 2, a hook-shaped joint segment 10 encompasses the adjacent joint segment 11. Here as well, a length compensation resulting from the length of the hook-shaped joint segment is realized via the articulation 3, meaning that the separation of two plate elements 2 relative to one another can be changed. As FIG. 8 shows, here as well a winding groove is provided (shown as an example and merely as a dashed line) that is applied on the plate top in the shown example (see FIG. 9). Given a still-flat winding plate, as in all other embodiment cases the conductor 8 is wrapped in the winding groove, after which the winding plate 1 is deformed in order to assume the curved shape, wherein the individual plate elements 2 pivot via the respective articulations. Here as well a fixing element 9 (which can be, as described, a plate-shaped or band-shaped or otherwise-shaped fixing element) is subsequently attached. For example, an insulation plate consisting of a fibrous tissue that is embedded in an epoxy resin support matrix, and that has on one side an adhesive layer with which it can be adhered to the conductor top is used as a fixing element. In addition to the use of flat fixing elements, it is also possible to use pre-shaped fixing elements.

Figure 10:
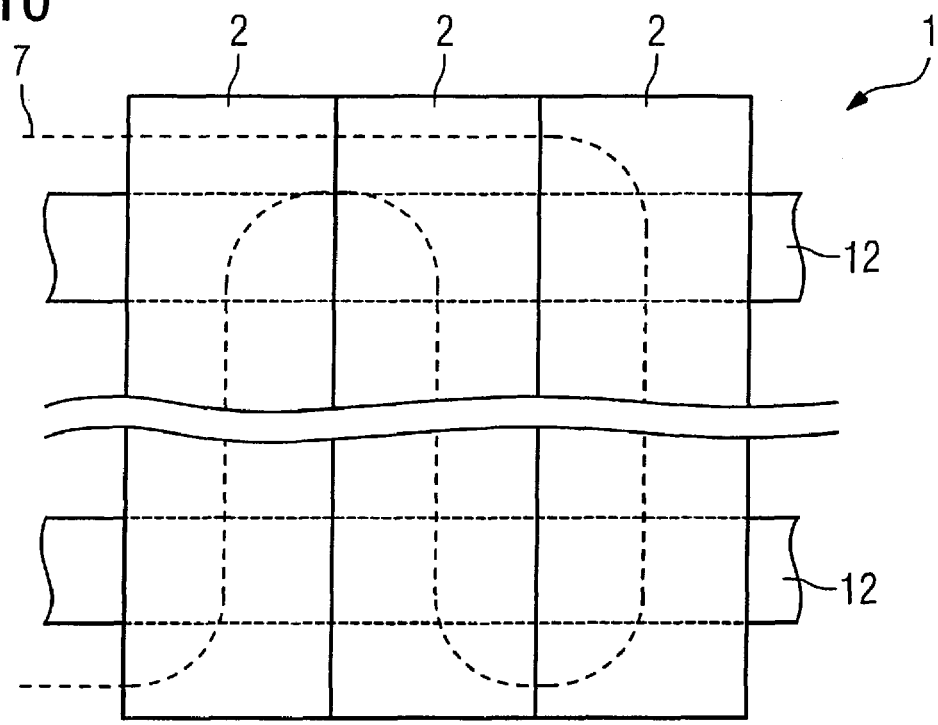
FIG. 10 illustrates a third embodiment of a winding plate in accordance with the invention.
Figure 11:
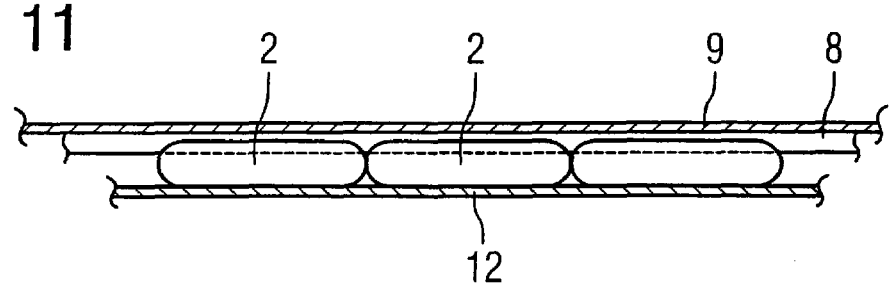
FIG. 11 is a side view of the winding plate of FIG. 10.
Figure 12:
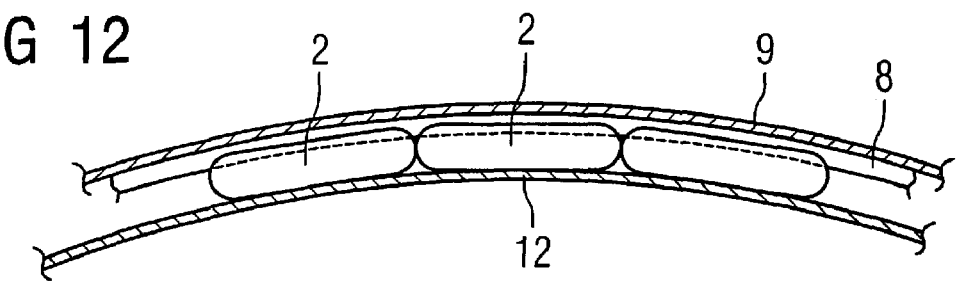
FIG. 12 is a side view with a curved winding plate and wound conductor together with fixing element in accordance with the invention.

FIGS. 10-12 show a third embodiment of a winding plate 1 that in turn consists of multiple plate segments 2. These are pivotally connected with one another via flexible connection elements 12. The connection elements 12 are, for example, metal bands (advantageously made from spring steel) that are welded to the individual plate elements 2 (here also rectangular in shape) by a spot weld. In the shown example, the band-shaped connection elements 12 run on the inside of the plate while the winding groove 7 (represented here only with dashed lines) runs on the outside of the winding plate 1 or, respectively, the plate elements 2. As FIG. 12 shows, here the winding wire is also already wrapped, which here also ensues given a flat winding plate 1, after which this is brought into the curved shape (as shown in FIG. 12) via a suitable deformation machine. The plate elements 2 thereby change their position relative to one another but nevertheless remain fixed to one another via the metal bands 12. The position fixing of the wound conductor 8 here also ensues via a fixing element 8 of the same type. Here the inherently stable sub-coil of the winding plate 1 can also be extracted after the fastening fixing element 9 to the conductor 8.

Figure 13:
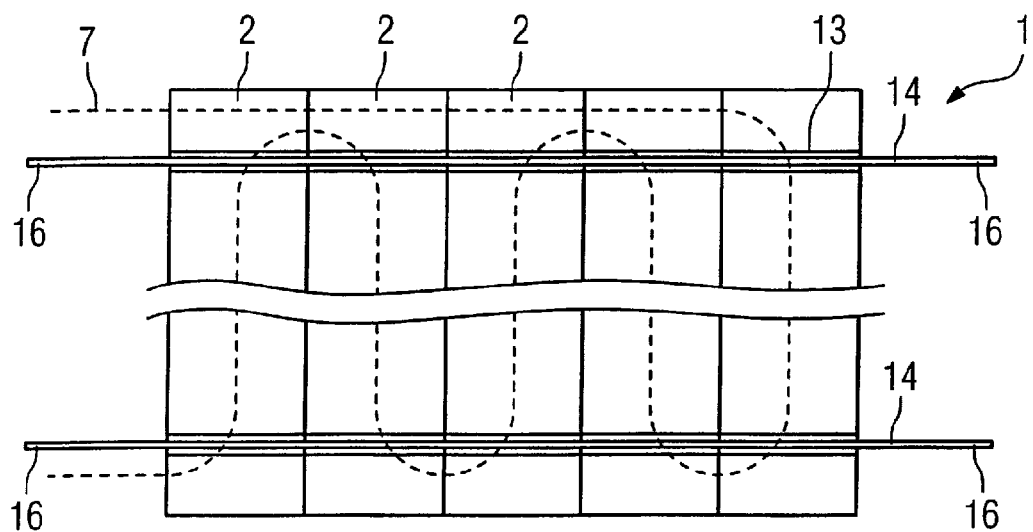
FIG. 13 illustrates a fourth embodiment of a winding plate in accordance with the invention.

FIG. 13 shows a further embodiment of a winding plate 1 according to the invention, again consisting of multiple plate elements 2 that are movable relative to one another in an arbitrary manner. A winding groove 7 is again provided (here as well only represented by dashed lines) that is introduced (for example milled) into the plate top. An additional groove 13 is provided that runs perpendicular to the respective pivot axes of the plate elements 2 and into which a tightening strap is inserted. The winding groove 7 extends over the tightening strap grooves 13. If a tightening strap 14 is now placed in every groove 13 and the conductor 8 is subsequently wrapped in the winding groove, it runs over the tightening straps 14.

Figure 14:
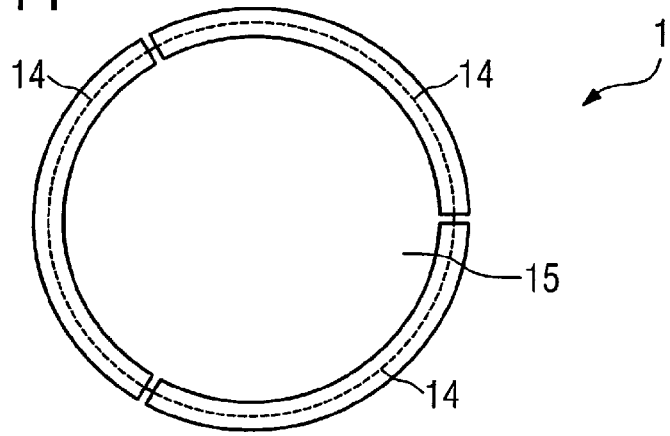
FIG. 14 shows a winding spindle with three attached winding plates corresponding to FIG. 13.
Figure 15:
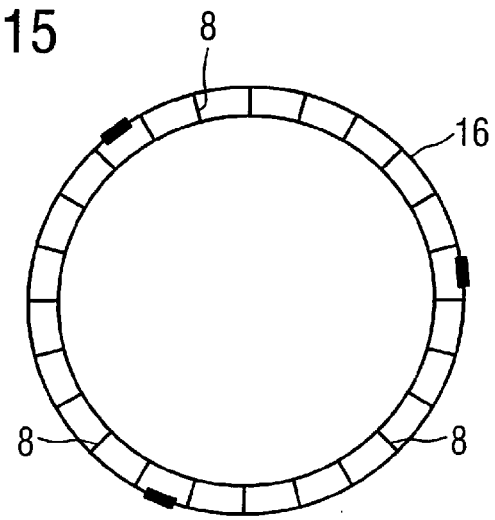
FIG. 15 shows the conductors, fixed via a tightening strap, of the three winding plates of FIG. 14, with removed winding plates.

This enables the winding plate to be attached to a winding spindle 15 that is only shown by way of example in FIGS. 14 and 15 and serves as part of a winding machine to produce a gradient coil, for example. In the shown example, three winding plates 1 are placed around the winding spindle 15; they circulate 360°, aside from only narrow edge separations. The tightening straps 14 of all winding plates are now connected with one another in the region of their free ends 16, as is exemplarily shown in FIGS. 14 and 15. Because the tightening straps lie below the respective conductor 8, the tightening straps 14 in the arrangement shown in FIG. 14 are situated on the outside around the respective conductor 8. The tightening straps 14 form a collective tightening strap 17 circulating 360°, which tightening strap 17 fixes the individual conductors 8 of the individual sub-coils on the winding spindle 15. This is shown in FIG. 15, wherein the individual conductors 8 are shown only in longitudinal section for clarity.

FIGS. 14 and 15 are only of an exemplary nature. The possibility naturally exists to place the winding plates 1 not directly on the winding spindle, but rather to place other components (for example of a gradient coil) on this in advance and to then place the winding plates on these components. However, in principle nothing changes in the manner of the foxing of the conductors via the tightening straps. After fixing the conductors 8 of the individual sub-coils, additional components (for example of a gradient coil) are constructed on these; however, the conductors remain fixed via the tightening straps. The entire structure is subsequently embedded in a castable material such as an epoxy resin, for example if a gradient coil is produced. The tightening straps remain tight around the conductors, are thus likewise embedded and form part of the entire gradient coil.

Although modifications and changes may be suggested by those skilled in the art, it is the intention of the inventors to embody within the patent warranted hereon all changes and modifications as reasonably and properly come within the scope of his contribution to the art.

We claim as our invention:

1. A winding plate assembly for an electrical conductor, comprising:
    a plurality of mechanically separate plate elements, each having an oblong rectangular shape with longitudinal edges, said plurality of plate elements being disposed successively adjacent to one another with the respective longitudinal edges of adjacent plate elements being parallel to each other;
    a plurality of mechanical articulations respectively mechanically connecting adjacent plate elements with each other, each mechanical articulation connecting said respective longitudinal edges of the adjacent plate elements with each other allowing pivoting, at said respective longitudinal edges, of the adjacent plate elements relative to each other, allowing said plate elements in succession to conform to a curved surface;
    each of said plate elements having a portion of an overall electrical conductor path configured therein; and
    a closed-loop conductor held in the respective portions of said conductor path in the respective plate elements, said closed-loop conductor also conforming to said curved surface by virtue of being held in said portions of said conductor path configured in the respective plate elements.

2. A winding plate as claimed in claim 1 wherein each of said articulations is comprised of bearing lugs respectively carried by said adjacent ones of said plate elements and an axel that penetrates said bearing lugs.

3. A winding plate assembly as claimed in claim 1 wherein said total conductor path is configured with a shape for a magnetic resonance gradient coil, and wherein said closed-loop conductor in said portions of said conductor path is a magnetic resonance gradient coil.

* * * * *